(12) United States Patent
Miyahara et al.

(10) Patent No.: US 6,755,127 B2
(45) Date of Patent: Jun. 29, 2004

(54) SCREEN PRINTING METHOD

(75) Inventors: Seiichi Miyahara, Fukuoka (JP);
Takahiro Fukagawa, Fukuoka (JP);
Minoru Murakami, Fukuoka (JP);
Michinori Tomomatsu, Fukuoka (JP);
Seiko Abe, Fukuoka (JP); Kimiyuki Yamasaki, Fukuoka (JP); Kunihiko Tokita, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/400,464

(22) Filed: Mar. 28, 2003

(65) Prior Publication Data

US 2003/0188646 A1 Oct. 9, 2003

Related U.S. Application Data

(62) Division of application No. 09/794,958, filed on Mar. 1, 2001, now Pat. No. 6,553,905.

(30) Foreign Application Priority Data

Mar. 7, 2000 (JP) ........................................ 2000-061494
Mar. 7, 2000 (JP) ........................................ 2000-061495

(51) Int. Cl.[7] ................................................ B41M 1/12
(52) U.S. Cl. ...................................... 101/129; 101/123
(58) Field of Search ................................ 101/114, 123, 101/124, 126, 129, 116, 119, 120

(56) References Cited

U.S. PATENT DOCUMENTS

| | | | |
|---|---|---|---|
| 4,622,239 A | 11/1986 | Schoenthaler et al. | |
| 4,720,402 A | 1/1988 | Wojcik | |
| 4,817,524 A | 4/1989 | Riemer | |
| 5,611,274 A | * 3/1997 | Tani | ............................ 101/123 |
| 5,806,423 A | 9/1998 | Tani | |
| 6,158,338 A | 12/2000 | MacRalid et al. | |
| 6,324,973 B2 | 12/2001 | Rossmeisl et al. | |

\* cited by examiner

Primary Examiner—Ren Yan
(74) Attorney, Agent, or Firm—McDermott, Will & Emery

(57) ABSTRACT

It is possible to obtain a screen printing method that may assure excellent printing qualities since the screen printing method of the present invention includes: (A) sliding a squeegee head with paste stored in the squeegee head on a mask plate, while the past is pressurized, and printing the paste on a substrate through pattern holes of the mask plate, (B) at least one step of (b) separating the squeegee head with the paste stored therein from the mask plate, and (e) sliding the squeegee head on the mask plate for a pre-squeezing purpose before the step (A). The step of separating the squeegee head from the mask plate includes the steps of (1) discontinuing the pressure application to the paste stored in the squeegee head, (2) horizontally moving the squeegee head by a predetermined distance while the bottom end portion of the squeegee head is abutted on the mask plate in a state of the pressure application being discontinued, and (3) moving the squeegee head upward off from the mask plate. In the step of pre-squeezing includes the steps of (1) pressurizing the paste stored in the squeegee head in a state of the squeegee head being abutted on the mask plate, and (2) horizontally moving the squeegee head while the bottom end portion of the squeegee head is abutted on the mask plate in a state of the paste being pressurized.

11 Claims, 5 Drawing Sheets

SCREEN PRINTING METHOD

This application is a divisional of application Ser. No. 09/794,958 filed on Mar. 1, 2000 now U.S. Pat. No. 6,553,905.

FIELD OF THE INVENTION

The present invention relates to a screen printing method for printing cream solder, conductive paste or like paste on a substrate.

BACKGROUND OF THE INVENTION

Conventionally, screen printing has been adopted for printing cream solder, conductive paste or like paste on substrates in a process of mounting electronic components on a substrate. This method comprises a process of setting a mask plate with pattern holes provided therein according to the printing portions and a process of printing paste on a substrate by squeezing through the pattern holes of the mask plate.

As a squeezing method for such screen printing, a method using a closed type squeegee head is known. In this method, a squeegee head provided with a paste storage container having an opening at the bottom thereof is used. With the opening abutted on the mask plate, the paste in the paste storage container is pressurized so that the paste is pushed and filled into the pattern holes of the mask plate through the opening. And, the squeegee head is slid on the mask plate, then the paste is filled into each pattern hole in order.

In such a conventional screen printing method using a closed type squeegee head, there are problems as described in the following. In the screen printing operation, the squeegee head is in a state such that the bottom opening thereof is always contacted on the surface of the mask plate. However, it is necessary to separate the squeegee head from the screen mask, for example, when making the arrangements for the purpose of type change and carrying out the maintenance of the apparatus.

In this case, the paste is always in contact with the mask plate via the bottom opening at the closed type squeegee head. Accordingly, when the squeegee head moves upward, some of the paste in the squeegee head is liable to remain sticking to the surface of the mask plate. And, in case there remains some paste on the mask plate, it is necessary to wipe off the paste sticking to the mask plate. Therefore, in the conventional method, there is a problem of such residual paste that is discarded wastefully. Moreover, it is necessary to wipe off each time the paste sticking to the mask plate, and consequently, there has been a problem of a loss of time required for the arrangements and maintenance.

On the other hand, cream solder or the like paste used for screen printing contains resin component. The resin component easily shows a hardening reaction. In order to prevent such hardening reaction of the paste, the paste is kept at a constant temperature in a refrigerator or the like until the paste is used. And, when the paste is used, it is timely taken out of the refrigerator, taking into account the predetermined time of leaving the paste in the atmosphere, and then the paste is placed into the squeegee head.

The viscosity of such paste will vary depending upon the ambient atmospheric conditions, and further, the viscosity is liable to change with the lapse of time. For example, (a) at the time when the paste is taken out of the refrigerator and placed in the printing apparatus, and (b) after starting to use the paste, when the paste has been left in the apparatus for a long time while the printing operation is discontinued, then suitable viscosity for printing cannot be obtained. Thus, when the viscosity of the past used for screen printing is not appropriate, it is impossible to obtain reliable printing qualities.

The present invention is intended to provide a screen printing method that may assure reliable printing qualities.

SUMMARY OF THE INVENTION

The screen printing method of the present invention comprises:

(A) a step of sliding a squeegee head with paste stored in the squeegee head on a mask plate while the paste is pressurized, and printing the paste on a substrate through a pattern hole of the mask plate;

(B) at least one step of (b) separating the squeegee head with the paste stored in the squeegee head from the mask plate; and (e) pre-squeezing the squeegee head on the mask plate before the step (A).

The step of separating the squeegee head from the mask plate comprises:

(1) a step of discontinuing the pressure application to the paste stored in the squeegee head;

(2) a step of horizontally moving the squeegee head by a predetermined distance while the bottom end portion of the squeegee head is abutted on the mask plate in a state of the pressure application being discontinued; and (3) a step of moving the squeegee head upward off from the mask plate.

The step of pre-squeezing comprises:

(1) a step of pressurizing the paste stored in the squeegee head in a state of the squeegee head being abutted on the mask plate; and (2) a step of horizontally moving the squeegee head while the bottom end portion of the squeegee head is abutted on the mask plate in a state of the paste being pressurized.

With the configuration, it is possible to assure reliable printing qualities.

Further, by the screen printing method comprising the (b) step, it is able to reduce the quantity of paste discarded wastefully without being used for printing, in addition to the advantage described above. Also, it is possible to avoid carrying out extra work for arrangements and maintenance.

At the other time, the screen printing method comprising the (e) step, it is able to lower the viscosity of paste making it appropriate for screen printing, thereby further improving the printing qualities.

DESCRIPTION OF REFERENCE NUMERALS

Figure 1:
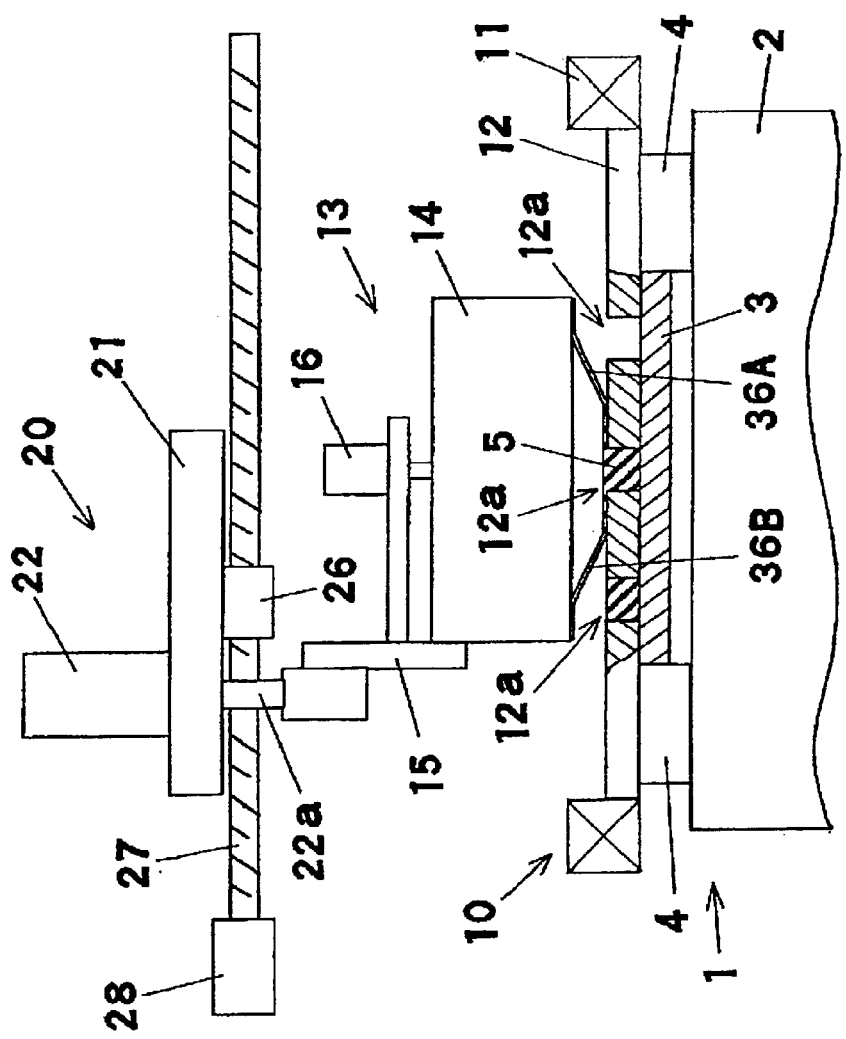
FIG. 1 is a front view of a screen printing apparatus in an embodiment of the present invention.

1 Positioning section
2 Substrate holder
3 Substrate
4 Clamper
5 Paste, cream solder
10 Screen mask
11 Holder
12 Mask plate
12a Pattern hole
13 Squeegee head
14 Printing section
15 Connection member
16 Cylinder
16a Rod
20 Head hoisting unit
21 Plate member
22 Cylinder
23 Slider
24 Guide rail
25 Frame
26 Nut
27 Feed screw
28 Motor
30 Main body
31 Cartridge
31a Push-out plate
31b Opening
32 Pressure plate
34 Throttle plate
34a Opening
35 Printing space
36A Scraping member
36B Scraping member

DETAILED DESCRIPTION OF THE INVENTION

A screen printing method in one embodiment of the present invention is a method for printing paste on a substrate through pattern holes of a mask plate by pressurizing the paste while sliding a squeegee head with the paste stored therein on the mask plate. The printing method comprises a step of separating the squeegee head from the mask plate.

The step of separating the squeegee head from the mask plate includes:
  (a) a step of discontinuing the pressure application to the paste stored in the squeegee head when separating the squeegee head from the mask plate;
  (b) a step of horizontally moving the squeegee head by a predetermined distance while the bottom end thereof is abutted on the mask plate in a state of the pressure application being discontinued; and
  (c) a step of moving the squeegee head upward off from the mask plate. In this way, the squeegee head is separated from the mask plate.

With this configuration, it is possible to realize a screen printing method that may assure excellent printing qualities. Further, the squeegee head can be separated from the mask plate while the paste is less in adhesion on the mask plate surface. As a result, it is possible to prevent the paste from sticking to the mask plate surface and remaining thereon.

Preferably, in a step of horizontally moving the squeegee head by a predetermined distance while the bottom end portion of the squeegee head is abutted on the mask plate in a state of the pressure application being discontinued, the paste sticking to the mask plate comes off the mask plate, and thus, the paste becomes released from the mask plate.

Preferably, the printing method further comprises
  (c) a step of changing the type of the substrate in a state of the squeegee head being separated from the mask plate.

Preferably, the printing method further comprises
  (c) a step of feeding the paste into the squeegee head in a state of the squeegee head being separated from the mask plate.

Preferably, the step of horizontally moving the squeegee head includes a step of horizontally moving the squeegee head in a state of a clamper of a substrate holder being abutted on the bottom surface of the mask plate.

Preferably, after horizontal movement of the squeegee head, the squeegee head starts moving upward off from the mask plate.

Preferably, while the squeegee head is moving horizontally, the squeegee head starts moving upward off from the mask plate.

Preferably, a part of the mask plate is held on the clamper which serves to hold the mask plate, the substrate is placed under the other part of the mask plate, and within the range of the position where the mask plate is held on the clamper, the squeegee head horizontally moves while abutting on the mask plate.

Preferably, the paste is air-tightly stored in the squeegee head, and when the squeegee head is in contact with the surface of the mask plate, the paste is air-tightly existing in a printing space surrounded by the squeegee head and the mask plate.

A screen printing method in another embodiment of the present invention is a method for printing paste on a substrate through pattern holes of a mask plate by pressurizing the paste while sliding a squeegee head with paste stored therein on the mask plate, the screen printing method comprises
  (a) a step of pressurizing the paste stored in the squeegee head which is abutted on the mask plate before starting the screen printing operation; and
  (b) a step of reciprocally moving the squeegee head in the horizontal direction while the bottom end portion of the squeegee head is abutted on the mask plate in a state of the paste being pressurized. In this way, the step of pre-squeezing is performed.

With this configuration, it is possible to obtain a screen printing method that may assure excellent printing qualities. The paste is stabilized at the predetermined viscosity that is suitable for printing. As a result, the printing qualities will be further improved.

Preferably, a step of horizontally moving the squeegee head includes a step of reciprocally moving the squeegee head in the horizontal direction.

Preferably, the paste pushed out into the printing space of the squeegee head is given a rolling motion during the step of pre-squeezing operation, and the paste is lowered in viscosity due to the rolling motion.

Preferably, the paste stored in the squeegee head is given a rolling motion during the step of the pre-squeezing operation, and the paste is lowered in viscosity due to the rolling motion.

Preferably, the printing method further comprises
  (f) a step of feeding the paste into the squeegee head, wherein the step of the pre-squeezing operation is performed between the step of feeding the paste into the squeegee head and the step of printing the paste on the substrate.

Preferably, the printing method further comprises (g) a step of discontinuing printing operation, wherein the step of the pre-squeezing operation is performed between the step of discontinuing the printing operation and the step of printing the paste on the substrate.

Preferably, the step of horizontally moving the squeegee head while the bottom end portion thereof is abutted on the mask plate in a state of the squeegee head being in contact with the mask plate includes a step of abutting a clamper against the bottom surface of the mask plate while the substrate holder is moved upward.

Preferably, a part of the mask plate is held on the clamper which serves to hold the mask plate; the substrate is placed under the other part of the mask plate; and within the range of the position where the mask plate is held on the clamper, the squeegee head horizontally moves while abutting on the mask plate.

Preferably, the step of horizontally moving the squeegee head in the step of the pre-squeezing operation includes a step of reciprocal movement at a constant speed.

Preferably, the step of horizontally moving the squeegee head in the step of the pre-squeezing operation includes at least one of (i) a movement of increasing the speed gradually from a low speed to a high speed; and (ii) a movement of repeating a pattern of speed change from low to high speed by a plurality of times.

Preferably, the paste is air-tightly stored in the squeegee heat, and when the squeegee head is in contact with the surface of the mask plate, the paste is given a rolling motion in a printing space surrounded by the squeegee head and the mask plate.

Cream solder, conductive paste and the like paste may be used as the paste material.

A screen printing method in an exemplary embodiment of the present invention will be described in the following with reference to the drawings.

Figure 2:
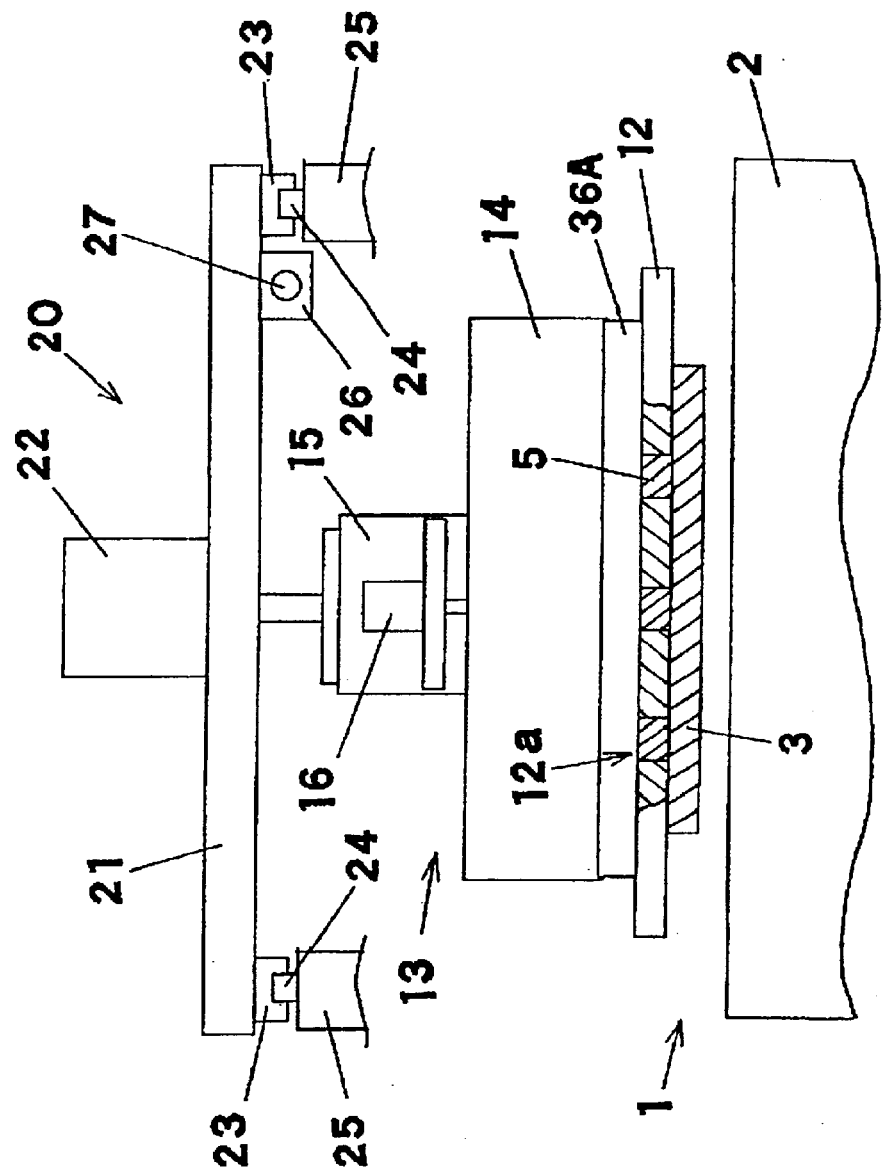
FIG. 2 is a side view of a screen printing apparatus in an embodiment of the present invention.
Figure 3:
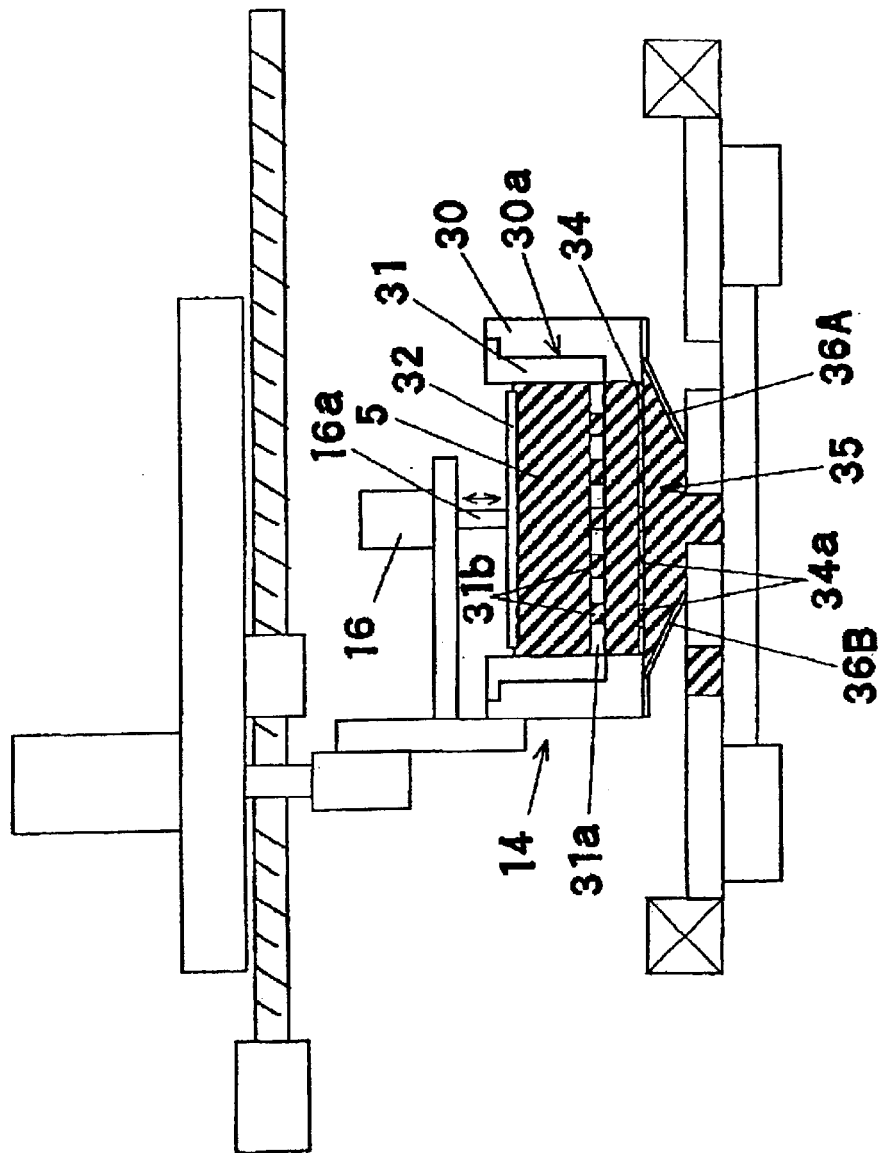
FIG. 3 is a fragmentary sectional view of a squeegee head of a screen printing apparatus in an embodiment of the present invention.
Figure 4:
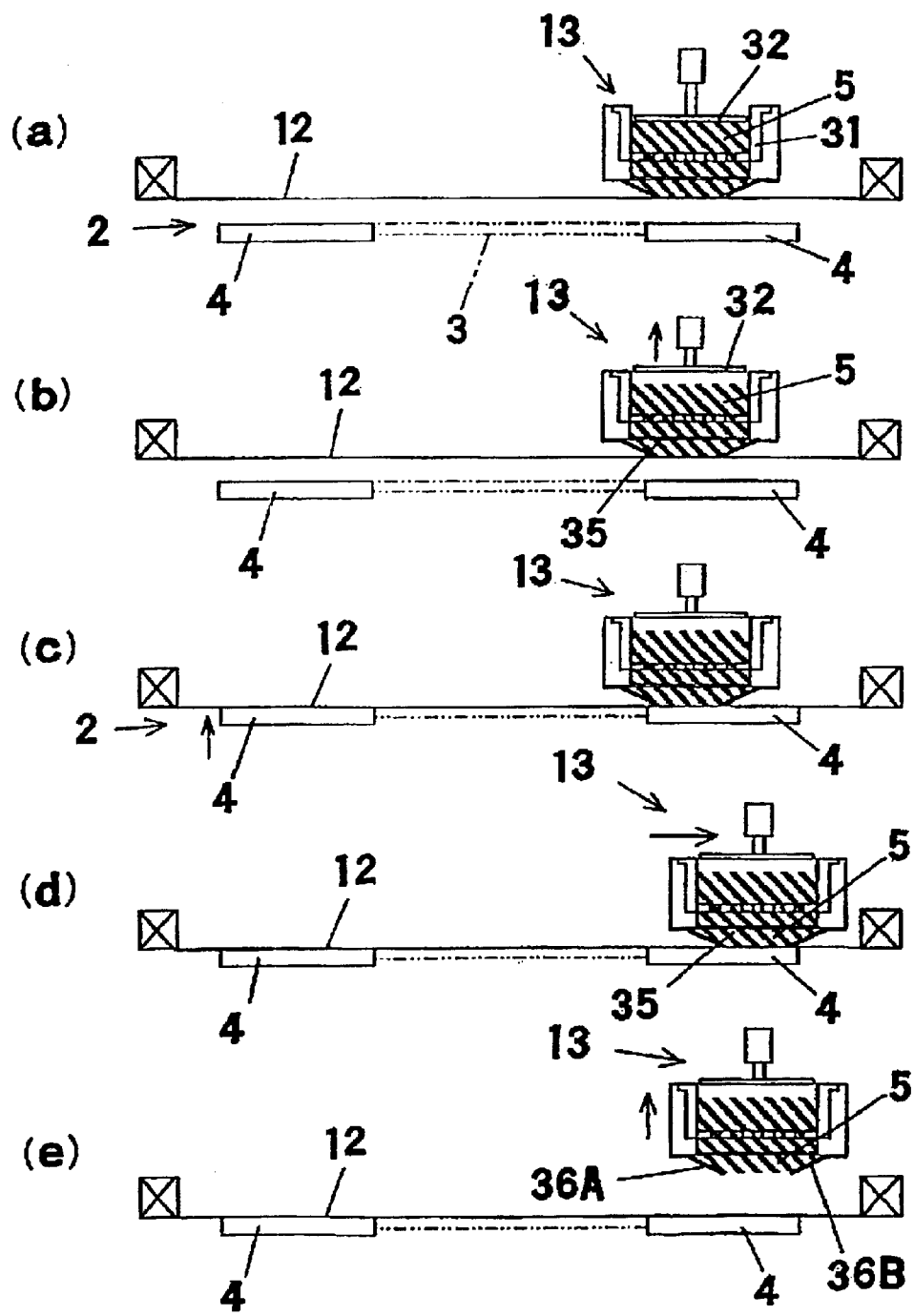
FIGS. 4a–4e are explanatory diagrams of processes based on a screen printing method in another embodiment of the present invention.

Exemplary Embodiment 1:

FIG. 1 is a front view of a screen printing apparatus in an exemplary embodiment of the present invention. FIG. 2 is a side view of a screen printing apparatus in an exemplary embodiment of the present invention. FIG. 3 is a fragmentary sectional view of a squeegee head of a screen printing apparatus in an exemplary embodiment of the present invention. FIG. 4 is an explanatory diagrams of processes based on a screen printing method in an exemplary embodiment of the present invention.

First, the structure of the screen printing apparatus will be described with reference to FIG. 1 and FIG. 2.

In FIG. 1 and FIG. 2, a substrate positioning section 1 includes a substrate holder 2 disposed on a movable table (not shown). The substrate holder 2 includes a clamper 4. A substrate 3 subjected to screen printing is held by the clamper 4. By driving the movable table, the substrate 3 held by the substrate holder 2 may be positioned in horizontal and vertical directions.

A screen mask 10 is disposed above the positioning section 1. The screen mask 10 includes a holder 11 and a mask plate 12 held by the holder 11. Pattern holes 12a are made in the mask plate 12, corresponding to the printing portions of the substrate 3 subjected to mask printing.

A squeegee head 13 is disposed on the screen mask 10 by means of a head hoisting unit 20 in a manner such that the squeegee head 13 is free to move up and down. The head hoisting unit 20 includes a cylinder 22 vertically disposed on a plate member 21. The squeegee head 13 is connected to the bottom end portion of a rod 22a of the cylinder 22 via a connection member 15. By driving the cylinder 22, the squeegee head 13 may be moved up and down against the mask plate 12. The squeegee head 13 is moved up and down against the screen mask 10. That is, the head hoisting unit 20 has a function as a means to move the squeegee head 13 up and down.

A slider 23 is fixed to each bottom end portion of the plate member 21 of the head hoisting unit 20. A guide rail 24 is disposed on the upper surface of a frame 25. The slider 23 is slidably fitted in the guide rail 24. A nut 26 is attached to the bottom of the plate member 21. A feed screw 27 screwed in the nut 26 is driven and turned by a motor 28.

When the motor 28 is driven, the plate member 21 moves horizontally, and the squeegee head 13 connected to the head hoisting unit 20 also moves horizontally. With the squeegee head 13 shifted down, when the motor 28 is operated, the squeegee head 13 moves horizontally on the mask plate 12. That is, the motor 28, the feed screw 27 and the nut 26 serve to horizontally move the squeegee head 13 on the mask plate 12. The motor 28, feed screw 27 and nut 26 serve a function as a moving means.

Cream solder 5 is used as the paste. A printing section 14 is provided at the bottom of the squeegee head 13. The printing section 14 abuts on the surface of the mask plate 12, and the cream solder 5 is filled into pattern hole 12a.

The printing section 14 will be described with reference to FIG. 3.

In FIG. 3, main body 30, having a block member, is long and narrow in shape along the widthwise direction of the mask plate 12. As shown in FIG. 2, the length of the main body 30 is set so as to cover the width of substrate 3. Recess 30a is formed in the main body 30. A cartridge 31 is removably mounted in the recess 30a. The cream solder 5 is stored in the cartridge 31.

The cartridge 31 has a function as a storage section (paste storage section) to store cream solder. A predetermined quantity of cream solder is previously stored in the cartridge 31. The cartridge 31 containing cream solder is mounted in the main body 30 when printing is started. A pressure plate 32 for pressurizing the cream solder 5 in the cartridge is fitted in the upper opening of the cartridge 31. The pressure plate 32 is connected to rod 16a of cylinder 16 arranged above the pressure plate 32. When the cylinder 16 is driven, the pressure plate 32 moves up and down in the cartridge 31.

Also, the bottom surface of the cartridge 31 serves a function as a push-out plate 31a for cream solder. The push-out plate 31a has multiple openings 31b. When the pressure plate 32 is pressed down by the cylinder 16, the cream solder 5 in the cartridge 31 is pressurized and pushed out through the openings 31b of the push-out plate 31a. The cylinder 16 and the pressure plate 32 serve a function as a pressure means for pressurizing the cream solder 5.

A throttle plate 34 is disposed at the bottom of main body 30. The throttle plate 34 also has multiple openings 34a the same as the push-out plate 31a of the cartridge 31. When cream solder 5 is pushed out by the cylinder 16, the cream solder 5 moves downward passing through the openings 31b of push-out plate 31a and the openings 34a of throttle plate 34. Then, the pushed out cream solder 5 reaches a printing space 35 formed beneath the main body 30. The printing space 35 is surrounded by two scraping members 36A, 36B disposed inwardly slantwise under the main body 30 and the bottom surface of the main body 30.

The scraping members 36A, 36B respectively form a front wall and a rear wall in the squeezing direction of the printing space 35. With the squeegee head 13 shifted down, the bottom ends of the scraping members 36A, 36B are abutted on the surface of the mask plate 12. In the printing operation, the printing space 35 accommodates the pressurized cream solder 5, and the cream solder 5 comes in contact with the surface of the mask plate 12 through the opening between the scraping member 36A and scraping member 36B.

When the pressure plate 32 is pressed down, the cream solder 5 in the cartridge 31 is pressurized. Consequently, the cream solder 5 moves into the printing space 35, passing through the push-out plate 31a and the throttle plate 34. There are area-reduced portions in the passage of cream solder 5. The area-reduced portions include many small openings 31b and 34a by which the sectional area of the solder passage is reduced. When the pressurized cream solder 5 passes through the area-reduced portions, the cream solder 5 decreases in viscosity and is improved in property to become suitable for screen printing. In this way, the cream solder 5 improved in viscosity is filled into the printing space 35.

In screen printing, with the printing space 35 filled with cream solder 5, the squeegee head 13 moves sliding on the mask plate 12. Thus, the cream solder 5 in the printing space 35 goes through the opening formed between the scraping members 36A, 36B and is filled into the pattern holes 12a of the mask plate 12.

And, as the squeegee head 13 moves, the cream solder 5 is filled into the pattern holes 12a in order. When all pattern holes 12a have been filled with cream solder 5, substrate holder 2 is moved down, separating the substrate from the mask plate 12. That is, the cream solder 5 in the pattern holes 12a moves downward along with the substrate 3, coming off of the pattern holes 12a, and thereby, the cream solder 5 is printed on the substrate 3. Thus, the screen printing operation is completed.

Next, a squeegee head separating operation in cream solder printing will be described with reference to FIG. 4. The squeegee head separating operation is performed when making arrangements for type change of substrate 3, feeding cream solder 5 into squeegee head 13, or performing maintenance of the apparatus. In this operation, the squeegee head 13 is moved upward off from mask plate 12.

In FIG. 4(a), while cream solder 5 in cartridge 31 is pressurized by pressure plate 32, squeegee head 13 is horizontally moved on mask plate 12, thereby finishing one cycle of printing operation. FIG. 4(a) shows a state with one cycle of printing operation competed. In this state of operation, substrate holder 2 is shifted down, and clamper 4 is in a position apart from the bottom of mask plate 12.

Next, as shown in FIG. 4(b), pressure plate 32 moves up to discontinue pressurizing cream solder 5. Then, the pressure of cream solder 5 in printing space 35 is released from the surface of mask plate 12.

After that, as shown in FIG. 4(c), substrate holder 2 moves up and one clampers 4 is abutted on the bottom surface of mask plate 12 just under squeegee head 13.

In this state of operation, motor 28 is operated, and as shown in FIG. 4(d), the squeegee head 13 horizontally moves on the mask plate 12 being supported on the upper surface of clamper 4. It is possible to horizontally move the squeegee head 13 in an optional position on the mask plate 12. Preferably, the squeegee head 13 is horizontally moved on the mask plate 12 being stably supported, for example, on the surface of clamper 4.

As the squeegee head 13 moves horizontally, cream solder 5 being in tight contact with the upper surface of mask plate 12 through the opening of printing space 35 moves sliding on the mask plate 12. In this way, the cream solder 5 sticking to the mask plate 12 comes off and released therefrom, greatly decreasing in adhesion.

And then, as shown in FIG. 4(e), cylinder 22 is driven to move squeegee head 13 upward. During this upward operation, in a state with the adhesion of cream solder 5 on mask plate 12 decreased, the bottom ends of scraping plates 36A, 36B come off from the mask plate 12.

By this method, the cream solder 5 in the printing space 35 may be prevented from sticking to the mask plate 12 and remaining thereon.

And it is possible to start the upward operation after completion of horizontal movement of the squeegee head 13. Also, it is possible to start the upward operation while moving the squeegee head 13 horizontally.

Accordingly, it is not necessary to remove the cream solder 5 remaining on the mask plate 12 as is required in the prior art when moving up the closed type squeegee head 13. Thus, wasteful work may be eliminated and it is possible to avoid the loss of time for arrangements and maintenance. Further, the quantity of cream solder discarded without being used for printing will be reduced, enhancing the effective use of resources. Also, since no cream solder unnecessarily remains on the mask plate, the printing accuracy is improved, resulting in improvement of the printing qualities.

Figure 5:
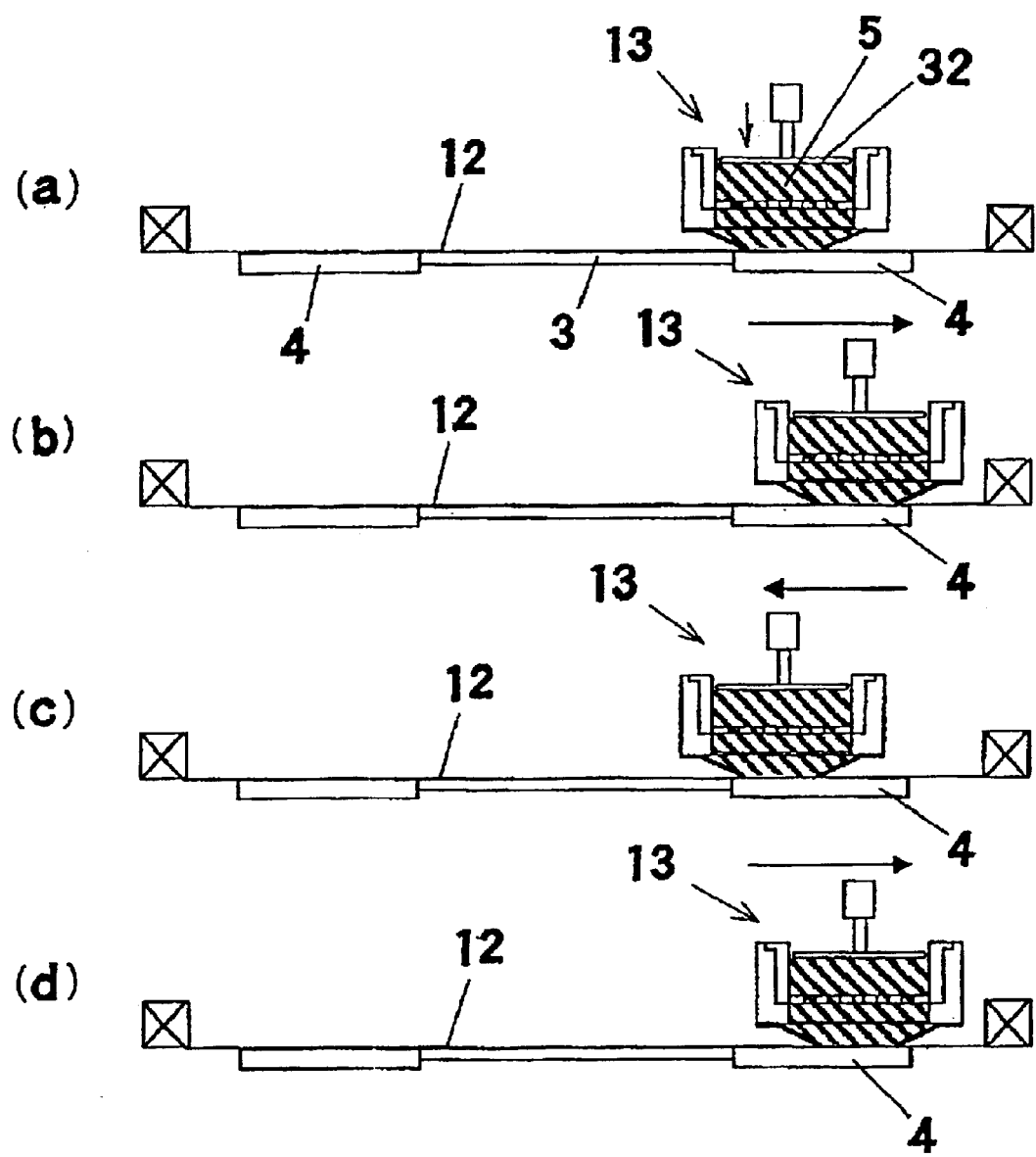
FIGS. 5a–5d are explanatory diagrams of processes based on a screen printing method in another embodiment of the present invention.

Exemplary Embodiment 2:

A screen printing method in another exemplary embodiment of the present invention will be described in the following with reference to FIG. 5. The screen printing apparatus shown in FIG. 1, FIG. 2 and FIG. 3 as described in the above exemplary embodiment 1 is used in this exemplary embodiment.

The description is given to the pre-squeezing operation in the method of printing cream solder 5 by squeegee head 13. The pre-squeezing operation is performed to make the viscosity of cream solder 5 appropriate for printing operation after feeding cream solder 5 into the squeegee head or during interruption of screen printing operation waiting for the next process.

First, in FIG. 5(a), squeegee head 13 moves down to mask plate 12, and the bottom end of same abuts on the mask plate 12. Then, substrate holder 2 moves upward, and clamper 4 is pressed against the bottom surface of the squeegee head 13 via the bottom surface of the mask plate 12. In this state of operation, pressure plate 32 moves down to pressurize cream solder 5 in the squeegee head 13.

Next, as shown in FIG. 5(b), motor 28 is driven, and then the squeegee head 13 horizontally moves to the right on the mask plate 12 within a range such that the bottom end abutting the mask plate 12 does not go beyond the range of clamper 4.

Subsequently, as shown in FIG. 5(c), the squeegee head 13 horizontally moves in the opposite direction. Further, as shown in FIG. 5(d), the squeegee head 13 horizontally moves again to the right. Such reciprocal movement of the squeegee head 13 is repeated by the predetermined number of times.

Due to the reciprocal movement of the squeegee head 13, the cream solder 5 filled in printing space 35 is given a rolling motion. And rolling of the cream solder 5 in the printing space 35 causes the cream solder 5 to be lowered in viscosity, and consequently, the cream solder 5 will be improved in fluidity. Generally, when the cream solder 5 is left at a standstill for many hours, the cream solder will increase in viscosity and become inappropriate for screen printing. On the other hand, pre-squeezing operation on cream solder 5 as described may decrease the viscosity of the cream solder 5. That is, "kneading" of cream solder 5 is effective to decrease the viscosity of the cream solder 5, and the cream solder 5 is then improved in quality and becomes suitable for screen printing. The screen printing operation is started after completion of such predetermined pre-squeezing operation. As a result, the printing accuracy and printing qualities may be improved. Incidentally, the word "viscosity" used in the above description may be replaced by "kinematic viscosity."

Preferably, the moving speed of the squeegee head 13 in the pre-squeezing operation is kept constant. Also, the moving speed of the squeegee head 13 gradually increases from a high speed to a low speed. Also, the squeegee head 13 repeats a pattern of speed change from low to high speed by a plurality of times. In this way, the squeegee head 13 changes its moving pattern to perform appropriate pre-squeezing operation in accordance with the properties and characteristics of the cream solder 5. Also, it is possible to reciprocally move the squeegee head 13 in an optional position on the mask plate 12. Preferably, the squeegee head 13 is moved in a state such that the mask plate 12 is stably supported by clamper 4 or the like. The squeegee head 13 is able to make a one-way movement instead of a reciprocal movement. However, the squeegee head 13 is preferable to make a reciprocal movement in order to further enhance the above-mentioned advantage.

Since the structure of the squeegee head 13 is of closed type, even in case of setting the moving pattern of squeegee head 13 to various patterns with high speeds and low speeds combined as described above for the purpose of effectively performing the pr-squeezing operation, the cream solder 5 to be kneaded is closed in a space between the printing space of squeegee head 13 and the mask plate. Therefore, the cream solder 5 may be prevented from spattering during the pre-squeezing operation. Accordingly, it is possible to freely set the pattern of pre-squeezing operation in accordance with the printing object. Also, it is possible to efficiently perform the pre-squeezing operation. As a result, the printing qualities may be improved.

Exemplary Embodiment 3:

A screen printing method in this exemplary embodiment comprises both of the screen printing method described in the exemplary embodiment 1 and the screen printing method described in the exemplary embodiment 2.

That is, the screen printing method comprises (a) a step of pressurizing paste while sliding a squeegee head with the paste stored therein on a mask plate and printing the paste on a substrate through pattern holes of the mask plate, (b) a step of separating the squeegee head with the paste stored in the squeegee head from the mask plate, and (e) a step of pre-squeezing operation by moving the squeegee head on the mask plate to perform squeezing of the paste before the step (a).

The step of separating the squeegee head from the mask plate includes (1) a step of discontinuing the pressure application to the paste stored in the squeegee head, (2) a step of horizontally moving the squeegee head by a predetermined distance while the bottom end portion of the squeegee head is abutted on the mask plate in a state of the pressure application being discontinued, and (3) a step of moving the squeegee head upward off from the mask plate.

The step of the pre-squeezing operation includes (i) a step of pressurizing the paste stored in the squeegee head while the squeegee head is abutted on the mask plate, and (ii) a step of horizontally moving the squeegee head while the bottom end portion of the squeegee head is abutted on the mask plate in a state of the paste being pressurized.

The detail of the present exemplary embodiment is the same as for the exemplary embodiment 1 and the exemplary embodiment 2.

With this configuration, the quantity of paste discarded without being used for printing will be reduced. Further, it is possible to avoid wasteful work for arrangements and maintenance, and also, to assure reliable printing qualities.

As described above, the present invention includes a step of discontinuing pressure application to internally stored paste when a squeegee is separated from a mask plate, a step of horizontally moving the squeegee head by a predetermined distance while the squeegee head is abutted on the mask plate in a state of the pressure application being discontinued, and a step of separating the squeegee head from the mask plate while the adhesion between the paste and the mask plate surface is decreased, and thereby, it is possible to prevent the paste from remaining on the mask plate surface. Accordingly, it is not necessary to carry out work to remove paste remaining on the mask plate. Thus, the time otherwise required for such extra work can be saved. Further, it is possible to reduce the quantity of paste discarded without being used for printing, thereby enhancing the effective use of resources.

Also, the internally stored paste is pressurized while the squeegee head is abutted on the mask plate, and the squeegee head abutted on the mask plate is reciprocally moved in the horizontal direction to perform pre-squeezing operation prior to start of the screen printing operation. Accordingly, the viscosity of the paste will be stabilized and, as a result, it is possible to assure excellent printing qualities.

What is claimed is:

1. A screen printing method comprising the steps of:
   (a) sliding a squeegee head with paste stored therein on a mask plate, while said paste is pressurized, and printing said paste on a substrate through a pattern hole of said mask plate, and
   (e) pre-squeezing said squeegee head on said mask plate to reduce the viscosity of said paste before the step (a),
   wherein said step of pre-squeezing comprises the steps of
      (i) pressuring said paste stored in said squeegee head in a state of said squeegee head being abutted on said mask plate;
      (ii) horizontally moving said squeegee head while the bottom end portion of said squeegee head is abutted on said mask plate in a state of said paste being pressurized.

2. The screen printing method of claim 1,
   wherein the step of horizontally moving said squeegee head includes a step of reciprocally moving said squeegee head in the horizontal direction.

3. The screen printing method of claim 1,
   wherein, due to said step of pre-squeezing, said paste pushed out into a printing space of said squeegee head is given a rolling motion, and
   the rolling motion of said paste causes the paste to be lowered in viscosity.

4. The screen printing method of claim 1, further comprising the step of
   (f) feeding said paste into said squeegee head,
   wherein said step of pre-squeezing is executed between the step of feeding said paste into said squeegee head and the step of printing said paste on said substrate.

5. The screen printing method of claim 1, further comprising the step of (g) discontinuing printing operation, wherein said step of pre-squeezing is executed between the step of discontinuing said printing operation and the step of printing said paste on said substrate.

6. The screen printing method of claim 1, wherein the step of horizontally moving said squeegee head while the bottom end portion of said squeegee head is abutted on said mask plate in a state of said squeegee head being abutted on said mask plate includes a step of abutting a damper on the bottom surface of said mask plate while a substrate holder is moved upward.

7. The screen printing method of claim 1, wherein a part of said mask plate is held on a damper which serves to hold said mask plate, said substrate is placed beneath the other part of said mask plate, and within the range of the position where said mask plate is supported on said damper, said squeegee head horizontally moves while abutting on said mask plate.

8. The screen printing method of claim 1, wherein said step of horizontally moving said squeegee head in said step of pre-squeezing includes a step of reciprocal movement at a constant speed.

9. The screen printing method of claim 1, wherein said step of horizontally moving said squeegee head in said step of pre-squeezing includes at least one of (i) a movement of increasing the speed gradually from a low speed to a high speed, and (ii) a movement of repeating a pattern of speed change from, low to high speed by a plurality of times.

10. The screen printing method of claim 1, wherein said paste is air-tightly stored in said squeegee head, and when said squeegee head is in contact with the surface of said mask plate, said paste in a state of being air-tightly stored is given a rolling motion in a printing space surrounded by said squeegee head and said mask plate.

11. The screen printing method of claim 1, further comprising the step of (b) separating said squeegee head with said paste stored therein from said mask plate, wherein said step of separating said squeegee head from said mask plate comprises the steps of (1) discontinuing pressure application to said paste stored in said squeegee head, (2) horizontally moving said squeegee head by a predetermined distance while the bottom end portion of said squeegee head is abutted on said mask plate in a state of said pressure application being discontinued, and (3) moving said squeegee head upward off from said mask plate.

* * * * *